(12) United States Patent
Kang et al.

(10) Patent No.: US 7,972,956 B2
(45) Date of Patent: Jul. 5, 2011

(54) METHOD FOR MANUFACTURING A WIRE STRUCTURE OF A SEMICONDUCTOR DEVICE

(75) Inventors: Chun Soo Kang, Yongin-si (KR); Jeon Kyu Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/491,886

(22) Filed: Jun. 25, 2009

(65) Prior Publication Data

US 2010/0164114 A1 Jul. 1, 2010

(30) Foreign Application Priority Data

Dec. 26, 2008 (KR) .......................... 10-2008-0134832

(51) Int. Cl.
*H01L 21/4763* (2006.01)

(52) U.S. Cl. ................. 438/637; 438/645; 257/E21.585

(58) Field of Classification Search .................. 438/584, 438/637, 618, 626, 629, 634, 643, 586, 645; 257/773, 774, E21.584, E21.585, E23.141
See application file for complete search history.

(56) References Cited

U.S. PATENT DOCUMENTS

| | | | |
|---|---|---|---|
| 7,023,044 B2* | 4/2006 | Kohyama et al. | 257/306 |
| 7,183,603 B2* | 2/2007 | Park | 257/298 |
| 2001/0054719 A1 | 12/2001 | Ahn et al. | |
| 2003/0218199 A1 | 11/2003 | Forbes et al. | |
| 2005/0218440 A1* | 10/2005 | Park | 257/298 |
| 2008/0088029 A1* | 4/2008 | Hong et al. | 257/776 |

FOREIGN PATENT DOCUMENTS

| | | |
|---|---|---|
| KR | 10-2004-0006500 | 1/2004 |
| KR | 10-0618907 | 8/2006 |
| KR | 10-2008-0097005 | 11/2008 |

* cited by examiner

*Primary Examiner* — Khiem D Nguyen
(74) *Attorney, Agent, or Firm* — Marshall, Gerstein & Borun LLP

(57) ABSTRACT

A wire structure of a semiconductor device capable of ensuring a process margin for bit line patterning in a 6F² cell layout of a semiconductor device, and a method for manufacturing the same.

12 Claims, 23 Drawing Sheets

METHOD FOR MANUFACTURING A WIRE STRUCTURE OF A SEMICONDUCTOR DEVICE

CROSS-REFERENCE TO RELATED APPLICATION

The priority of Korean patent application No. 10-2008-0134832 filed Dec. 26, 2008, the disclosure of which is incorporated herein by reference in its entirety, is claimed.

BACKGROUND OF THE INVENTION

1. Field of the Invention

The invention generally relates to a semiconductor device, and more particularly, to a wire structure including a bit line and a method for manufacturing the same.

2. Brief Description of Related Technology

In order to increase an integration degree of a semiconductor device, various modification on a cell layout have been attempted to integrate more circuit patterns within a limited area of a wafer or a semiconductor substrate. In a Dynamic Random Access Memory (DRAM) device, there have been attempted changes on an arrangement of active regions, on which transistor devices are formed, from $8F^2$ cell layout into $6F^2$ cell layout.

The DRAM device is configured so that word lines and bit lines are arranged perpendicular to each other. In the $8F^2$ cell layout, rectangular active regions, major axes of which are extended in a direction perpendicular to the word line, are repeatedly arranged. However, in the $6F^2$ cell layout, active regions, major axes of which are extended in a direction diagonally intersecting with the word line, are repeatedly arranged. Therefore, a distance between adjacent bit lines is decreased as compared to that of the $8F^2$ cell layout and a memory cell can be formed within a smaller area.

FIGS. 1 and 2 are a plan view and a cross-sectional view illustrating bit lines in the $6F^2$ cell layout.

Referring to FIG. 1, an isolation region 15 that delimits an active region 11 in a diagonal pattern is formed on a semiconductor substrate 10 in a Shallow Trench Isolation (STI) structure. The active region 11 in the diagonal pattern is arranged in a pattern extending in a diagonal direction that intersects a bit line 30 at a non-right angle, for example, an angle of about 27°. In this active region 11, a word line including a gate that diagonally intersects the active region 11 at an angle of about 63° is formed to thereby configure a transistor structure (not shown). Also, the bit line 30 is arranged so as to be electrically connected to the active region 11 through a bit line contact 20.

A memory cell of a DRAM device includes one transistor and one capacitor (not shown), and the capacitor is stacked above the bit line 30. In an under layer of the bit line contact 20, as shown in FIG. 2, a first insulation layer 41 insulating the semiconductor substrate 10 from the bit line 30 is introduced and a storage node contact pad 51 to be electrically connected to a storage node or a lower electrode and a bit line contact pad 55 to be electrically connected to the bit line 30 are introduced penetrating the first insulation layer 41. The bit line contact 20 is formed so as to penetrate a second insulation layer 43, and a third insulation layer 45 is introduced so as to cover the bit line 30.

The storage node is formed above the bit line 30 and a storage node contact 61 to connect this storage node and the storage node contact pad 51 is penetratingly formed between the bit lines 30. Because, a first distance D1 between adjacent bit lines 30 is very narrow due to reductions in the design rule, a contact hole for the bit line contact 61 can be formed as a Self Aligned Contact (SAC). As the storage node contact 61 is formed in the SAC process, a capping layer 37 above the bit line 30 and spacers 39 attached to side walls of the bit line 30 act as etch barriers that resist against the etch, upon formation of the storage node contact hole.

In order that the storage node contact 61 and the bit line contact 20 are insulated from each other, a second portion 35 of the bit line 30, overlapping the bit line contact 20, is designed to have a Critical Dimension (CD) wider than that of a linear-shaped first portion 31 of the bit line 30. That is to say, the second portion 35 of the bit line 30 is designed to have a wider CD so that the storage node contact 61 and the bit line contact 20 have a second distance D2. Therefore, a planar layout of the bit line is designed as a dog bone-shape in which the second portion 35 has a wider CD and the first portion 31 has a narrower CD as shown in FIG. 1.

In order to ensure the larger first distance D1 between adjacent bit lines 30, the first portion 31 of the bit line 30 is designed to have a narrow CD. This is for restricting signal interference between adjacent bit lines 30 and inducing more stable gap filling of the third insulation layer 45, which is formed to fill between the bit lines 30, as the design rule is decreased to 40 nanometers (nm) scale. However, as the bit line 30 is designed to have a dog bone-shape as described above, it becomes more difficult to transfer the bit line 30 onto the semiconductor substrate 10 by a photolithography process. That is to say, because the bit line 30 is designed in a dog bone-shape having the second portion 35 with larger CD, it becomes quite difficult to accurately transfer this dog bone-shape onto the semiconductor substrate 10. Therefore, it is difficult to ensure a process margin for patterning of the bit line 30 in this dog bone-shape and a short between the bit lines 30 may result therefrom after an etch process.

Because it is difficult to accurately transfer the bit line 30 onto the semiconductor substrate 10 in a designed shape as the design rule is decreased to less than 40 nm, it becomes difficult to form the bit line 30 so that the first portion 31 of the bit line 30 has a desired CD. Accordingly, it becomes difficult for the capping layer 37 and the spacer 39 to act as the etch barrier in the subsequent SAC process for forming the storage node contact 61. Therefore, a short can result between the storage node contact 61 and the bit line 30, and it becomes difficult to ensure the process margin. Moreover, because an upper portion of the spacer 39 adjoining the capping layer 37 is formed having a gently curved profile, this shoulder portion can be lost in the SAC etch to expose the bit line 30.

Accordingly, it would be desirable to develop a method capable of patterning the bit line 30 with a shape more accurately corresponding to the designed shape. It would also be desirable to develop a method capable of preventing a short generated by the loss due to the SAC etch upon subsequent formation of the storage node contact.

SUMMARY OF THE INVENTION

Disclosed herein are a wire structure of a semiconductor device capable of ensuring a process margin for bit line patterning in a $6F^2$ cell layout, and a method for manufacturing the same.

In one embodiment, the method includes obtaining a layout of an active region in a semiconductor substrate, the layout extending in a direction diagonally intersecting with a layout of a bit line, forming an isolation layer that delimits the active region, and forming over the semiconductor substrate a stack of a first insulation layer, an etch stop layer, and a second insulation layer. The method also includes forming a contact hole penetrating the stack, forming over the second insulation layer a first mask layer, the first mask layer including a filler that fills the contact hole, and patterning the first mask layer to expose a portion of the second insulation layer according to the layout of the bit line. The method further includes selectively etching the exposed portion of the second insulation layer using the first mask pattern and the filler as an etch mask to form a trench exposing a surface of the etch stop layer over a bottom thereof and partially overlapping with the contact hole, selectively removing the first mask pattern and the filler, forming a spacer over a side wall of the trench and a side wall of the contact hole, forming a bit line contact which fills the contact hole and the bit line which partially fills the trench to expose an upper side part of the spacer, and forming a capping layer over the bit line, the capping layer filling the trench to be connected to the spacer and protecting the upper part of the bit line.

Preferably, the bit line is delimited to a straight line in which a Critical Dimension (CD) of the portion intersecting with the active region and a CD of a portion extended from the intersection portion toward an outside are equal.

Preferably, the active region is arranged in plural according to a $6F^2$ cell layout.

Preferably, the method may further include forming a bit line contact pad below the first insulation layer, wherein the bit line contact pad electrically connects the active region and the bit line contact.

Preferably, the forming of the contact hole includes forming over the first insulation layer a second mask layer including a carbon layer and a first interfacial separation layer including silicon oxynitride (SiON), forming over the first interfacial separation layer a first photoresist pattern exposing the portion where the bit line and the active region intersect with each other; and selectively etching the second mask layer using the first photoresist pattern as an etch mask to form a second mask pattern. The method further preferably includes selectively etching the first insulation layer using the second mask pattern as an etch mask to form the contact hole.

Preferably, the forming of the first mask layer includes redepositing carbon over the second mask pattern.

Preferably, the first mask layer includes a carbon layer.

Preferably, the patterning of the first mask layer includes forming over the first mask layer a second interfacial separation layer including silicon oxynitride (SiON), forming over the second interfacial separation layer a second photoresist pattern exposing a portion of the layout of the bit line, and selectively etching the first mask layer using the second photoresist pattern as an etch mask to form the first mask pattern.

Preferably, a CD of the exposed portion of the second photoresist is equal to a CD of the contact hole.

Preferably, the forming of the spacer includes forming a spacer layer on side walls of the trench and the contact hole, and etching back the spacer layer to expose the etch stop layer on bottoms of the trench and the contact hole.

Preferably, the forming the bit line includes forming a barrier metal layer covering the bottoms of the trench and the contact hole, depositing over the barrier metal layer a metal layer including tungsten (W), and etching back the metal layer to expose an upper side part of the spacer.

Preferably, the forming of the capping layer includes depositing a third insulation layer including silicon nitride, the third insulation layer filling up the trench, and planarizing the third insulation layer by Chemical Mechanical Polishing (CMP).

In another embodiment, a method for manufacturing a wire structure of a semiconductor device includes obtaining a layout of an active region in a semiconductor substrate, the layout extending in a direction diagonally intersecting a layout of a bit line, forming an isolation layer that delimits the active region, and forming over the semiconductor substrate a stack of a first insulation layer, an etch stop layer, and a second insulation layer The method also includes forming a contact hole penetrating the stack, forming over the second insulation layer a first mask layer, the first mask layer including a filler that fills the contact hole, and patterning the first mask layer to expose a portion of the second insulation layer according to the layout of the bit line. The method further includes selectively etching the exposed portion of the second insulation layer using the first mask pattern and the filler as an etch mask to form a trench exposing a surface of the etch stop layer over a bottom thereof and partially overlapping with the contact hole, selectively removing the first mask pattern and the filler, forming a spacer over a side wall of the trench and a side wall of the contact hole forming a bit line contact which fills the contact hole and the bit line which partially fills the trench to expose an upper side part of the spacer, forming a capping layer over the bit line, the capping layer filing the trench to be connected to the spacer and protecting the upper part of the bit line, performing, on the second insulation layer, a Self Aligned Contact (SAC) etch process using the capping layer and the spacer as an etch barrier to form a storage node contact hole the penetrates the stack and forming a storage node contact filling the storage node contact hole.

Preferably, the forming of the storage node contact hole includes forming over the second insulation layer a third mask pattern having a line type opening part, which transverses a plurality of the bit lines, and selectively etching a portion of the second insulation layer exposed by the third mask pattern.

Preferably, the forming of the storage node contact includes depositing a conductive layer filling the storage node contact; and performing a need separation by planarizing the conductive layer with inclusion of CMP.

In a further embodiment, a wire structure of a semiconductor device includes a semiconductor substrate having an isolation region that delimits an active region, a stack disposed over the semiconductor substrate, the stack including a first insulation layer, an etch stop layer, and a second insulation layer. The structure also includes a bit line having a layout extending in a direction diagonally intersecting the active region and partially filling a trench formed in such a way that a portion of the second insulation is etched to expose a surface of the etch stop layer. The structure includes a bit line contact filling a contact hole that penetrates the stack overlapps the bit line, a capping layer filling up the trench to protect an upper part of the bit line and having an upper surface with a height equal to that of the second insulation layer, and a spacer disposed between a side wall of the trench and the bit line and a side wall of the contact hole and the bit line contact, the spacer having an upper part connected to the capping layer.

Preferably, the spacer has an outer face with a vertical profile equal to side face profiles of the trench and the contact hole.

Preferably, upper and lower perimeters of the spacer are equal in size.

Embodiments of the present invention can provide a wire structure of a semiconductor device capable of ensuring a process margin for bit line patterning in a $6F^2$ cell layout and a method for manufacturing the same.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
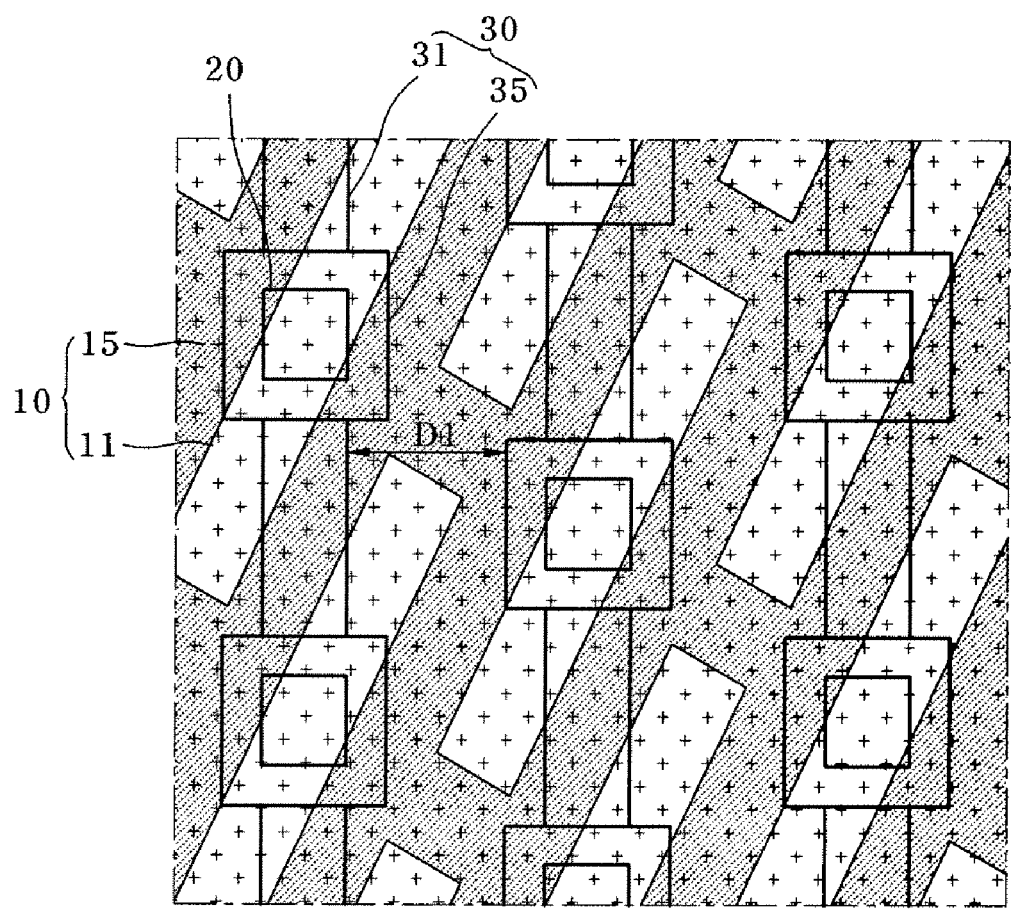
FIGS. 1 and 2 are a plan view and a cross-sectional view, respectively, illustrating bit lines in a $6F^2$ cell layout; and, FIGS. 3 through 23 are views illustrating a wire structure of a semiconductor device and a method for manufacturing the same in accordance with an embodiment of the present invention.

While the disclosed wire structure and method of making the same are susceptible of embodiments in various forms, there are illustrated in the drawings (and will hereafter be described) specific embodiments thereof, with the understanding that the disclosure is intended to be illustrative, and is not intended to limit the invention to the specific embodiments described and illustrated herein.

DESCRIPTION OF SPECIFIC EMBODIMENTS

In a preferred embodiment, a bit line structure that is connected to an active region of a $6F^2$ cell layout is formed using a dual damascene process to realize a first spacer that surrounds a side wall of a bit line contact and a second spacer that surrounds a side wall of the bit line. By the introduction of the first spacer, the bit line can be formed in a straight line having a CD equal to that of the bit line contact and, thus, it is possible to ensure a larger process margin when etch patterning the bit line.

Because it is possible to realize a layout of the bit line not of a dog bone-type, but in a straight line-type, it is possible to ensure a larger process margin upon photolithographic exposure and development process in transferring the bit line onto a wafer or a semiconductor substrate. It is also possible to obtain a larger etch process margin in a selective etch process accompanying the photolithography process. Because the bit line contact can be effectively and stably isolated by the first spacer, it is possible to maintain the bit line contact in a larger CD. Therefore, it is possible to reduce a resistance of the bit line contact.

Also, because it is possible to more effectively restrict generation of a short between the storage node contact and the bit line, and the storage node contact and the bit line contact by the first and second spacers, it is possible to form a plurality of storage contacts in a line type SAC process in which a line type opening part contains a plurality of contacts. Therefore, it is possible to ensure a larger process margin in the SAC process of forming the storage contact node.

FIGS. 3 through 23 are views illustrating a wire structure of a semiconductor device and a method for manufacturing the same in accordance with an embodiment of the present invention.

Figure 3:
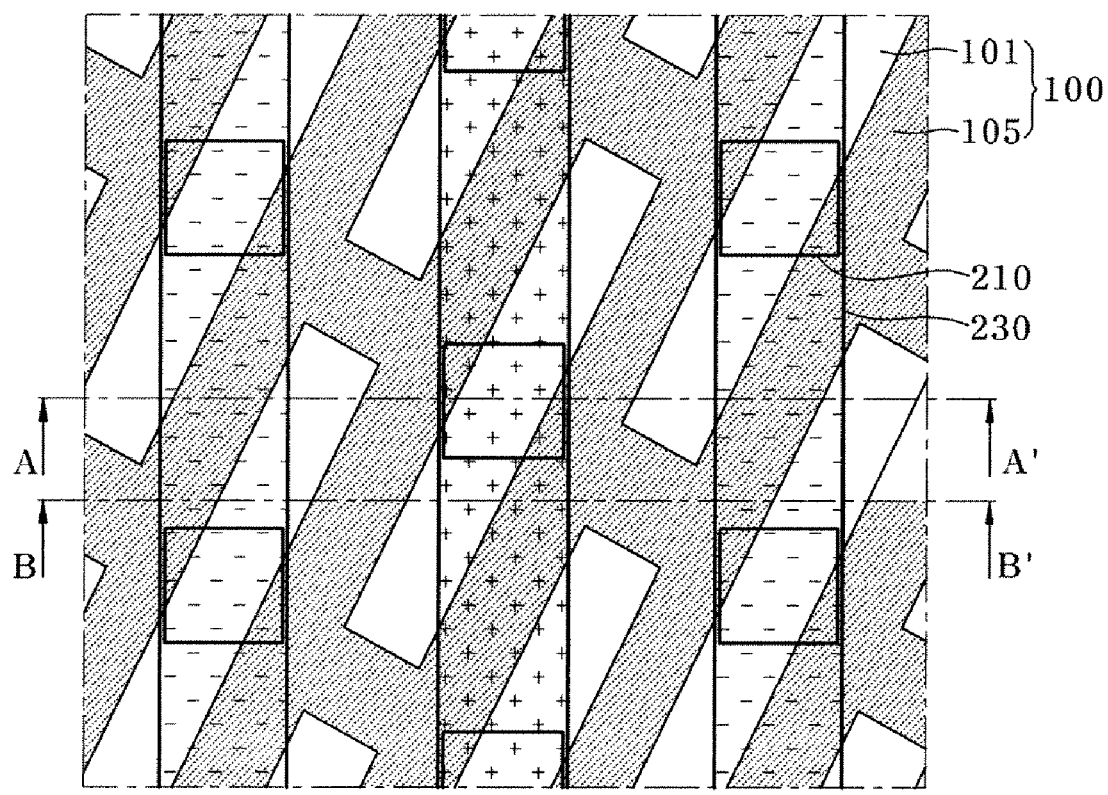
Figure 4:
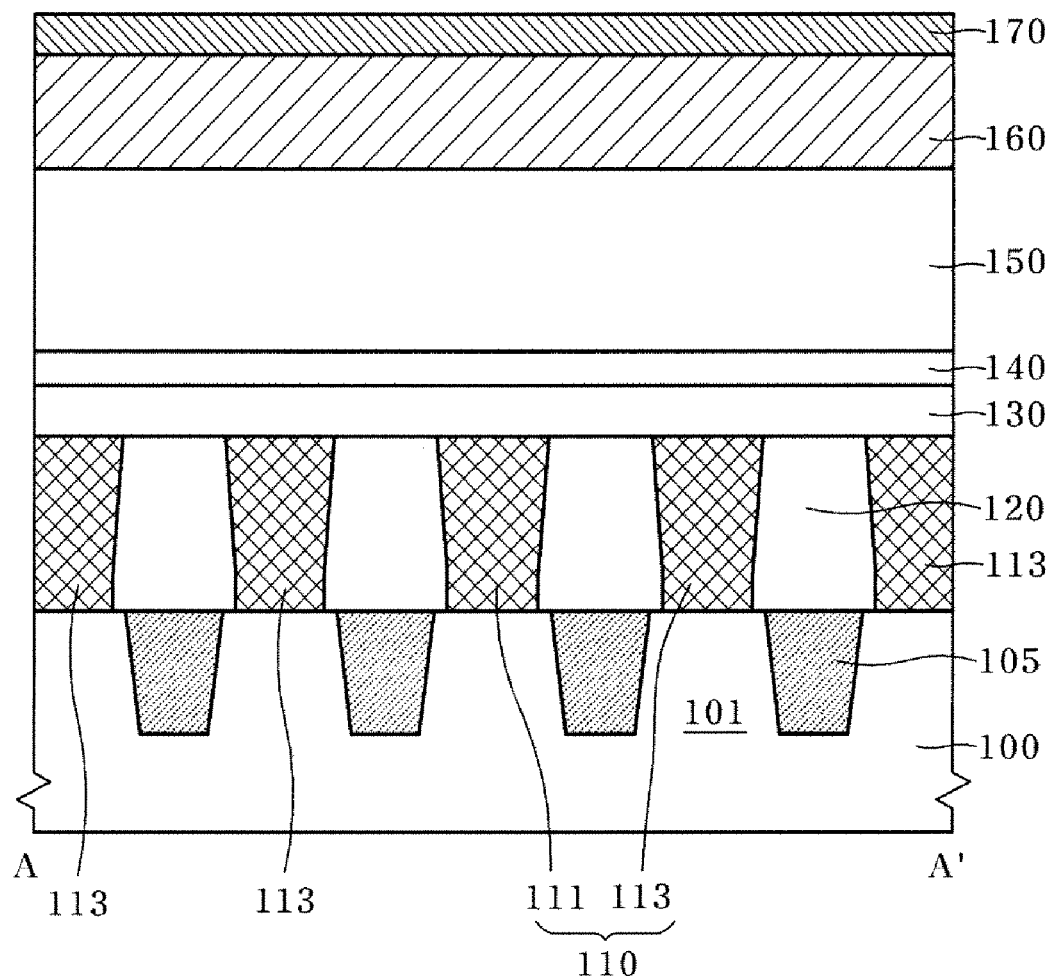

Referring to FIGS. 3 and 4, an active region 101 (in which a device such as a transistor is to be formed) is arranged over a semiconductor substrate 100 according to a $6F^2$ cell layout. The active region 101 is arranged in a layout that extends in a straight line direction diagonally intersecting a bit line 230. An isolation region 105 that delimits the active region 101 can be formed in a STI isolation structure, as shown in FIG. 4, which shows a cross-section taken along a line A-A' in FIG. 3. The line A-A' in FIG. 3 is for showing a cross-section of a portion of a bit line contact 210 and a line B-B' is for showing a cross-section of the bit line 230 in a portion where the bit line contact 210 is not arranged.

The bit line contact 210 is arranged in a position where the bit line 230 and the active region 105 intersect with each other. In the present embodiment, the layout of the bit line contact 210 and the layout of the bit line 230 have equal CD. Because the portion of the bit line 230 overlapping the bit line contact 210 is designed to have a CD equal to that of the bit line contact 210, the bit line contact 210 can have a larger CD than the active region 105. Because the bit line contact 210 has a larger CD, it is possible to reduce the contact resistance between the bit line contact 210 and the active region 105, and the contact resistance between the bit line contact 210 and the bit line 230.

Because the bit line 230 has a shape of a straight line, the bit line 230 and adjacent bit lines 230 are arranged in a repeated shape of line and space. This repeated shape can increase regularity of the pattern and, thus, can increase resolution in a photolithography process for transferring the layout of the designed bit line 230 onto the semiconductor substrate 100. Therefore, it is possible to improve an exposure process margin in the photolithography, and the pattern which is actually formed over the semiconductor substrate 100 can be formed with a shape more accurately corresponding to the designed layout of the bit line 230.

In order to realize the layout as shown in FIG. 3 over an actual semiconductor substrate 100 or wafer, as shown in FIG. 4, the isolation region 105 that delimits the active region 101 is formed, including an insulation layer, over the semiconductor substrate 100 and a gate and the like (not shown) are formed over the active region 101 to realize a transistor constructing a memory cell of a DRAM device.

After that, contact pads 110 which are electrically connected to the active region 101 of the semiconductor substrate 100 are penetratingly formed between the gates. These contact pads 110 are formed so as to penetrate a lower insulation layer 120, which covers the semiconductor substrate 100, and consist of a bit line contact pad 111 aligned with the bit line contact (210 in FIG. 3) and storage node contact pads 113 aligned with portions of the active region 101 exposed at both sides of the bit line (230 in FIG. 3). The storage node contact pad 113 is electrically connected to a storage node of a capacitor through a storage node contact (not shown), which is penetratingly introduced between the bit lines 230. This contact pad 110 is formed by depositing a conductive polysilicon layer, chemically mechanically polishing the deposited conductive polysilicon layer, and performing node separation.

A first insulation layer 130 for electrically insulating the contact pads 110 is formed by depositing an insulation material such as silicon oxide ($SiO_2$) and an etch stop layer 140 is formed over the first insulation layer 130. The etch stop layer 140 can be formed by depositing an insulation material, such as silicon oxynitride (SiON), having different etch rate from the first insulation layer 130 to be able to realize an etch selectivity. A second insulation layer 150 for providing a mold for patterning the bit line (320 in FIG. 3) is formed over the etch stop layer 140 by depositing an insulation material, such as silicon oxide.

After sequentially depositing a stack of the first insulation layer 130, the etch stop layer 140, and the second insulation layer 150, a first mask layer 160 is deposited and used as an etch mask for forming a contact hole which penetrates through this stack is deposited. The first mask layer 160 is formed as a layer that functions as a hard mask. The first hard mask 160 includes an insulation material (e.g. carbon layer) having an etch selectivity to silicon oxide where the first and second insulation layers 130, 150 include silicon oxide. When the first mask layer includes a carbon layer, a first interfacial separation layer 170 is formed to prevent mixing or reaction between the carbon layer and a photoresist is formed. The first interfacial separation layer 170 can be formed by depositing silicon oxynitride (SiON) having an etch selectivity to silicon oxide.

Figure 5:
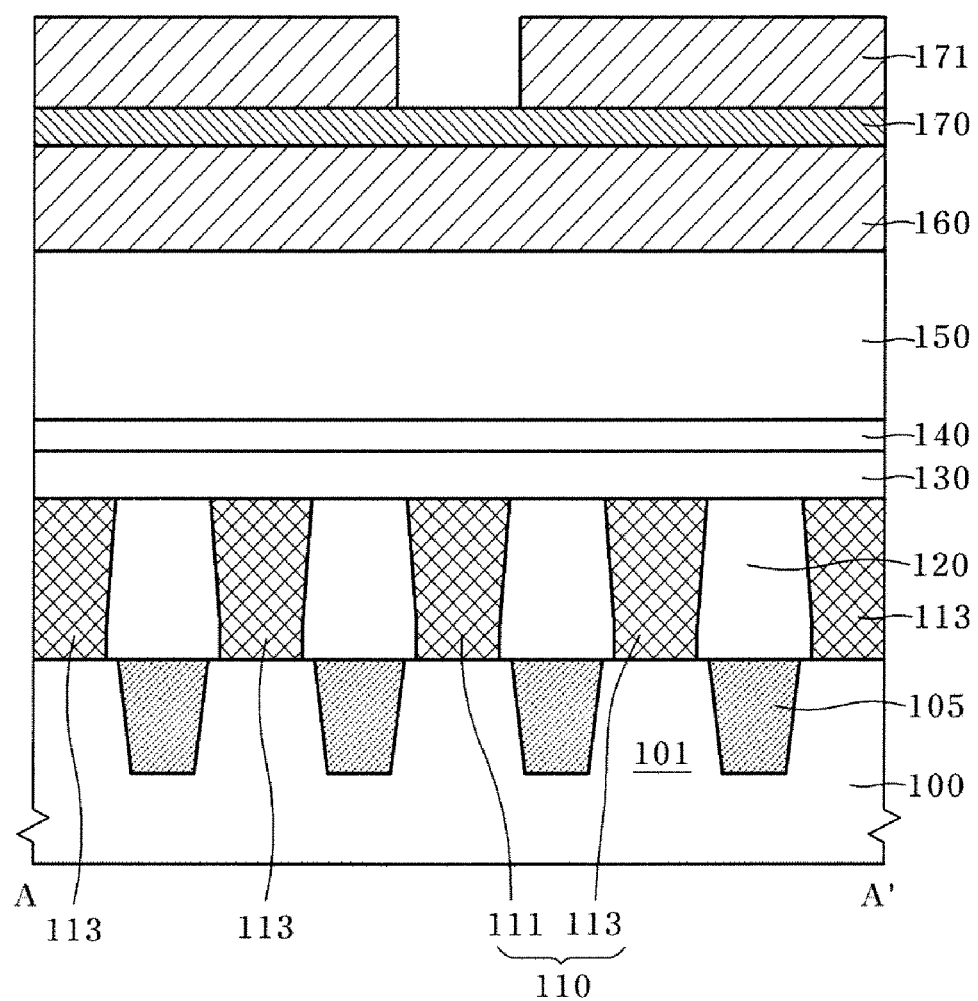

Referring to FIG. 5, a first photoresist pattern 171 is formed over the first interfacial separation layer 170. The first photoresist pattern 171 is formed as a pattern having an opening that exposes a portion where the bit line (230 in FIG. 3) and the active region 101 in FIG. 3) intersect with each other (i.e. the portion to be formed with the bit line contact (210 in FIG. 3)). At this time, the first photoresist pattern 171 is formed by exposure-transferring the layout of the bit line contact 210 in FIG. 3.

Figure 6:
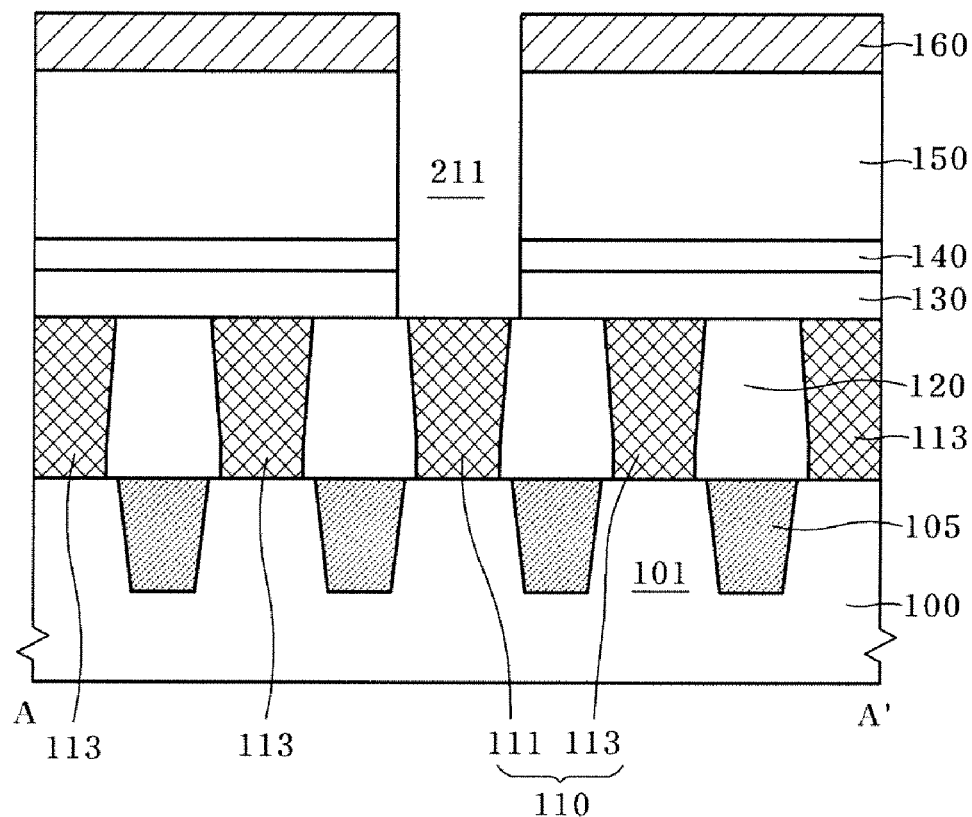

Referring to FIG. 6, the first mask layer is selectively etched using the first photoresist pattern 171 as an etch mask to pattern a first mask pattern 160. Using the first mask pattern 160, the second insulation layer 150, the etch stop layer 140, and the first insulation layer 130 therebelow are sequentially etched to form a contact hole 211 that exposes the bit line contact pad 111. The contact hole 211 provides the shape of the bit line contact (210 in FIG. 3).

Figure 7:
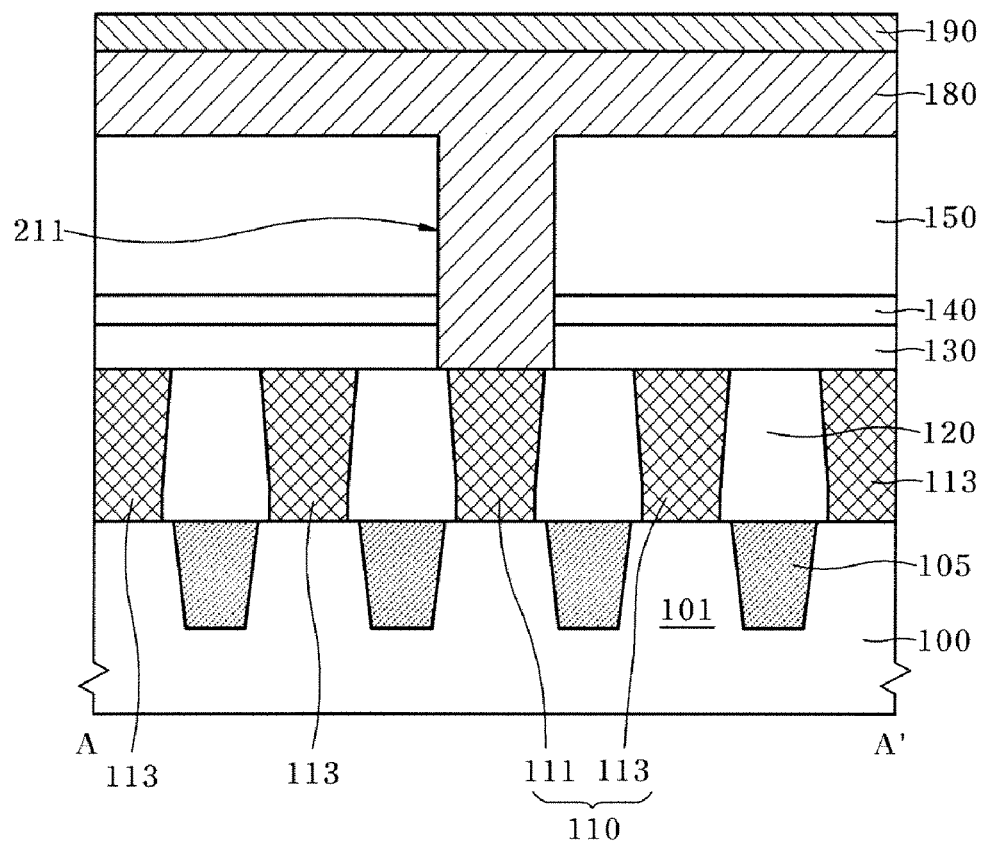

Referring to FIG. 7, prior to filling the contact hole 211 with the bit line contact (210 in FIG. 3), a second mask layer 180 is deposited and fills the contact hole 211. The second mask layer 180 can be deposited after the remaining portion of the first mask pattern 160 is selectively removed. Alternatively, the second mask layer 180 can be deposited, if necessary, as a carbon layer over the remaining portion of the first mask layer 160 when the first mask pattern 160 is a carbon layer. A second interfacial separation layer 190 is formed over the carbon layer of the second mask layer 180 to restrict reaction of the second mask layer 180 with the subsequent photoresist. The second interfacial separation layer 190 can include silicon oxynitride.

Figure 8:
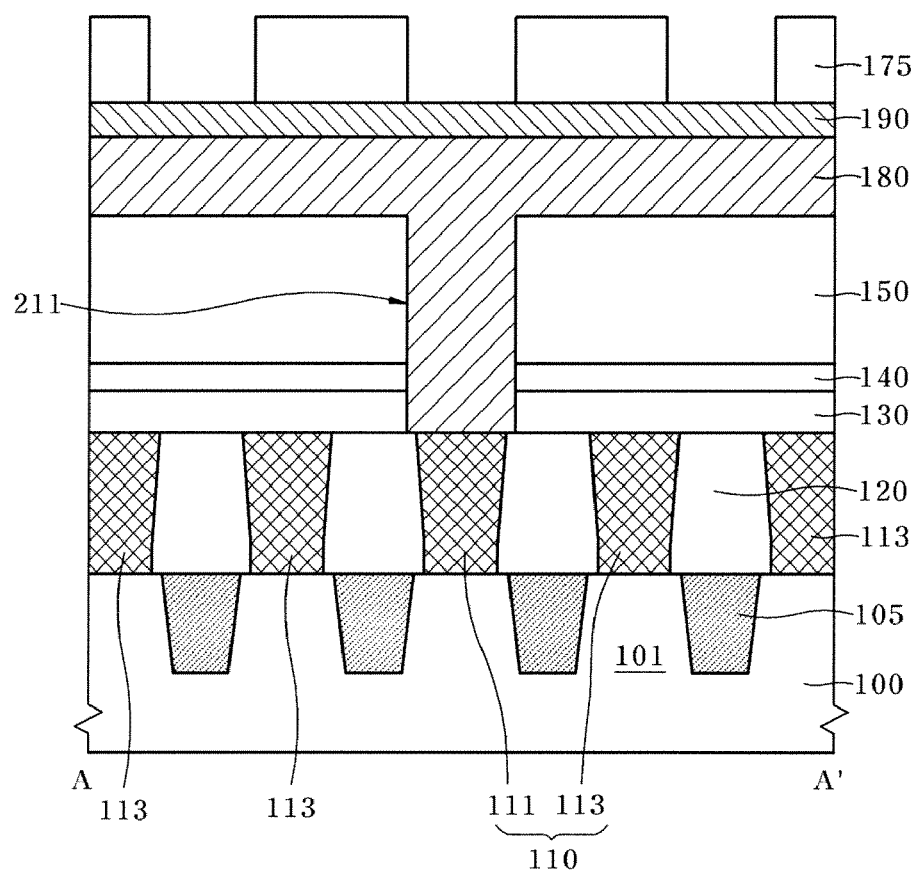

Referring to FIG. 8, a second photoresist pattern 175 is formed over the second interfacial separation layer 190. The second photoresist pattern 175 is formed to have an opening part that opens the portion corresponding to the layout of the bit line 230 in FIG. 3. Because the bit line 230 is delimited in a shape of a straight line, it is possible to improve an exposure resolution in the exposure and development process of patterning the second photoresist pattern 175. Because the bit line 230 is regularly arranged in a shape of line and space, higher fidelity of the pattern shape can be realized in a photolithography process for transferring such shape. Therefore, because the second photoresist pattern 175 can be formed with a pattern accurately corresponding to the designed shape of the bit line 230, the second photoresist pattern 175 can be formed with a fine pattern required in a device, a design rule of which is below 40 nanometers (nm).

Figure 9:
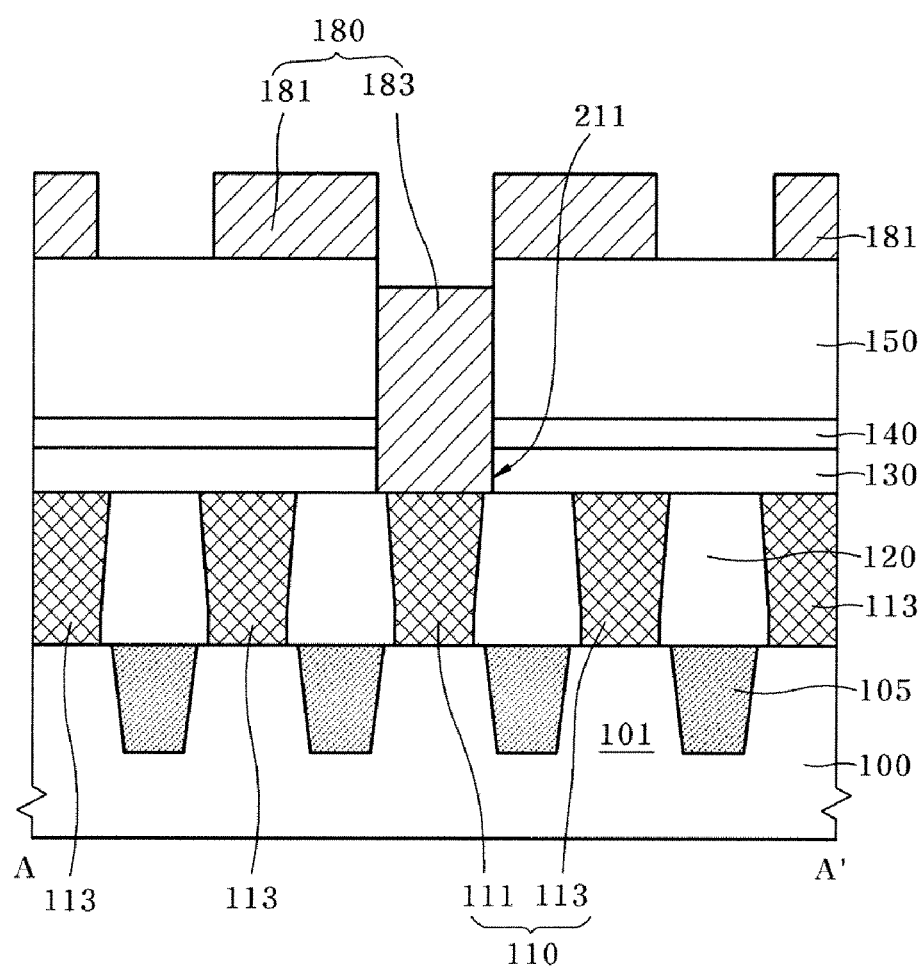

Referring to FIG. 9, the second mask layer 180 is selectively etched using the second mask layer 180 as an etch mask to pattern a second mask pattern 181. At this time, the portion of the second mask layer 180 that fills the contact hole 211 remains as a filler 183.

Figure 10:
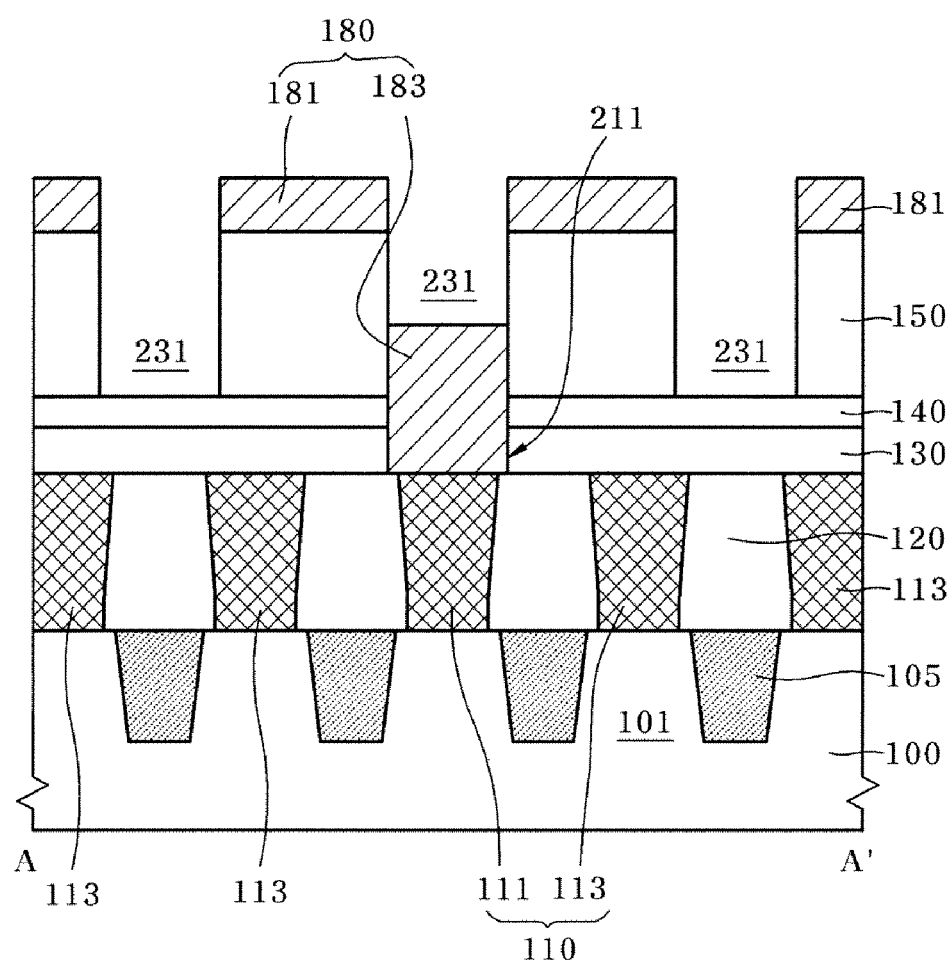
Figure 11:
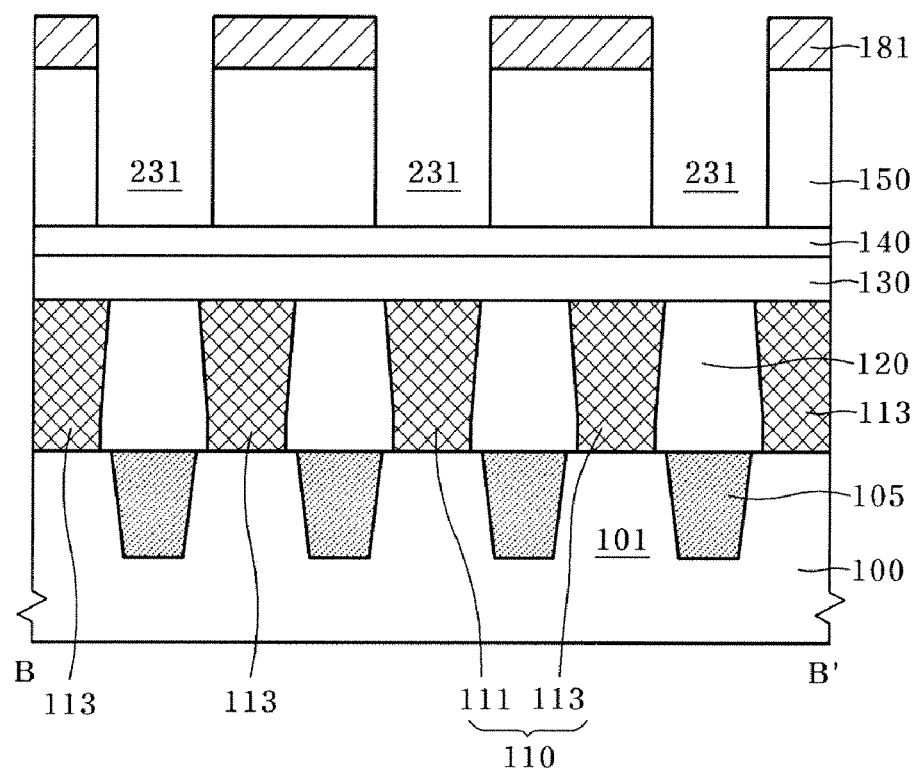

Referring to FIGS. 10 and 11, the exposed portion of the second insulation layer 150 is selectively etched using the second mask pattern 181 and the filler 183 as an etch mask. At this time, the etch is carried out until the surface of the etch stop layer 140 is exposed, to thereby form a trench 231 that penetrates the second insulation layer 150. This trench 231 overlaps the contact hole 211 for the bit line contact 210 according to the layout of the bit line 230 in FIG. 3. The trench 231 is formed as a mold in a shape of the bit line (230 in FIG. 3). Because the contact hole 211 is blocked by the filler 183 and, thus, protected from the etch process, the profile of the contact hole 211 can be maintained in an initially-formed shape.

After the trench 231 is formed, the second mask pattern 181 and the filler 183 used as an etch mask are selectively removed. Because the second mask layer 180, forming the second mask pattern 181 and the filler 183, includes a carbon layer, the second mask pattern 181 and the filler 183 can be stripped and removed by an ashing process using oxygen ($O_2$) plasma.

Figure 12:
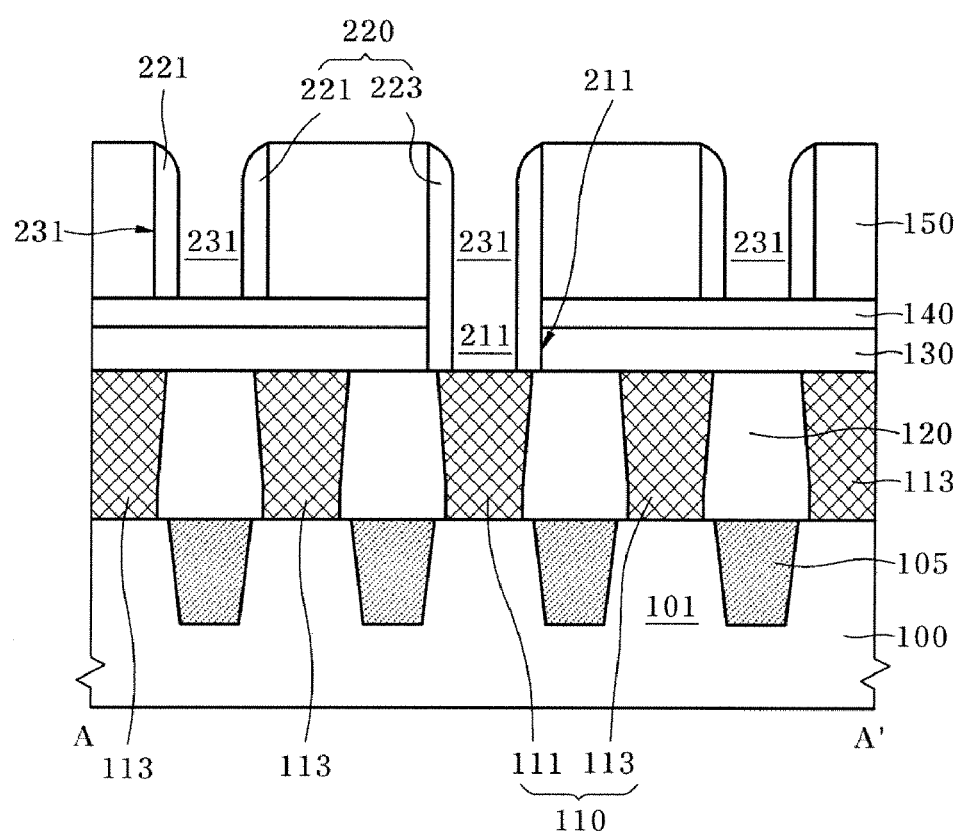
Figure 13:
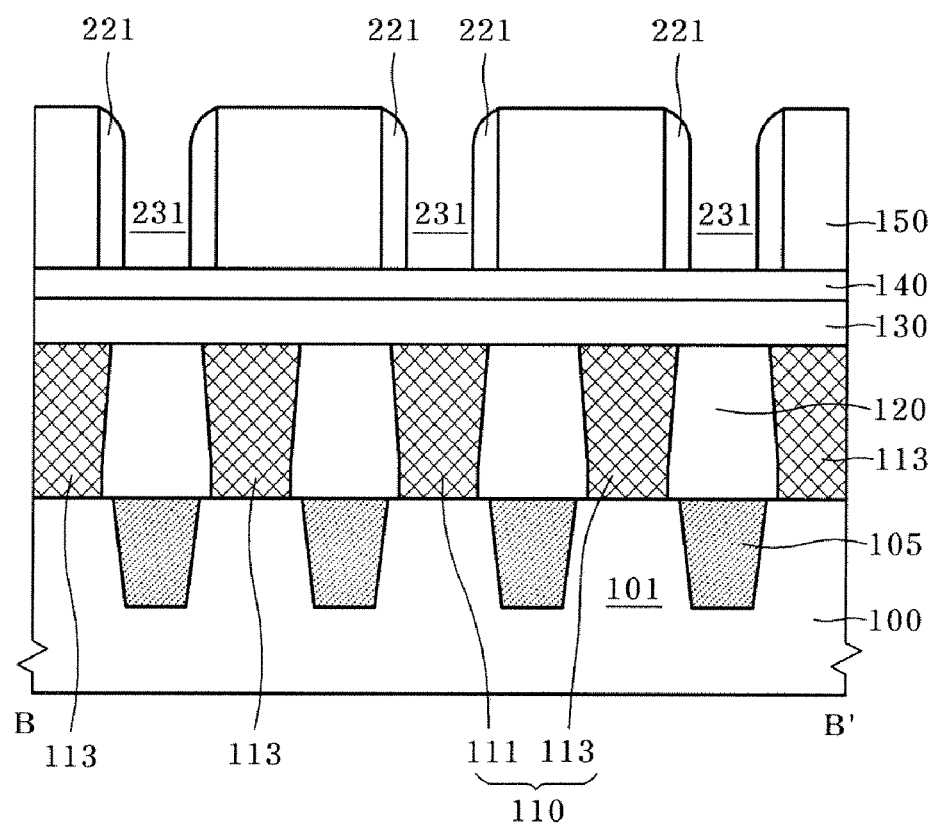

Referring to FIGS. 12 and 13, spacers 220 are attached to side walls of the trench 231 and the contact hole 211. The spacer 220 is formed by depositing an insulation material, such as silicon nitride ($Si_3N_4$), having an etch selectivity to the silicon oxide, and performing anisotropic etch or etch back. This spacer 220 can be formed including a first spacer 221 which covers the side wall of the trench 231 and a second spacer 223 which is extended from the first spacer to cover the side wall of the contact hole 211. By this spacer 220, side walls of the first insulation layer 130 and the second insulation layer 140, which are exposed as the side walls of the contact hole 211 and the trench 231, are blocked.

Figure 14:
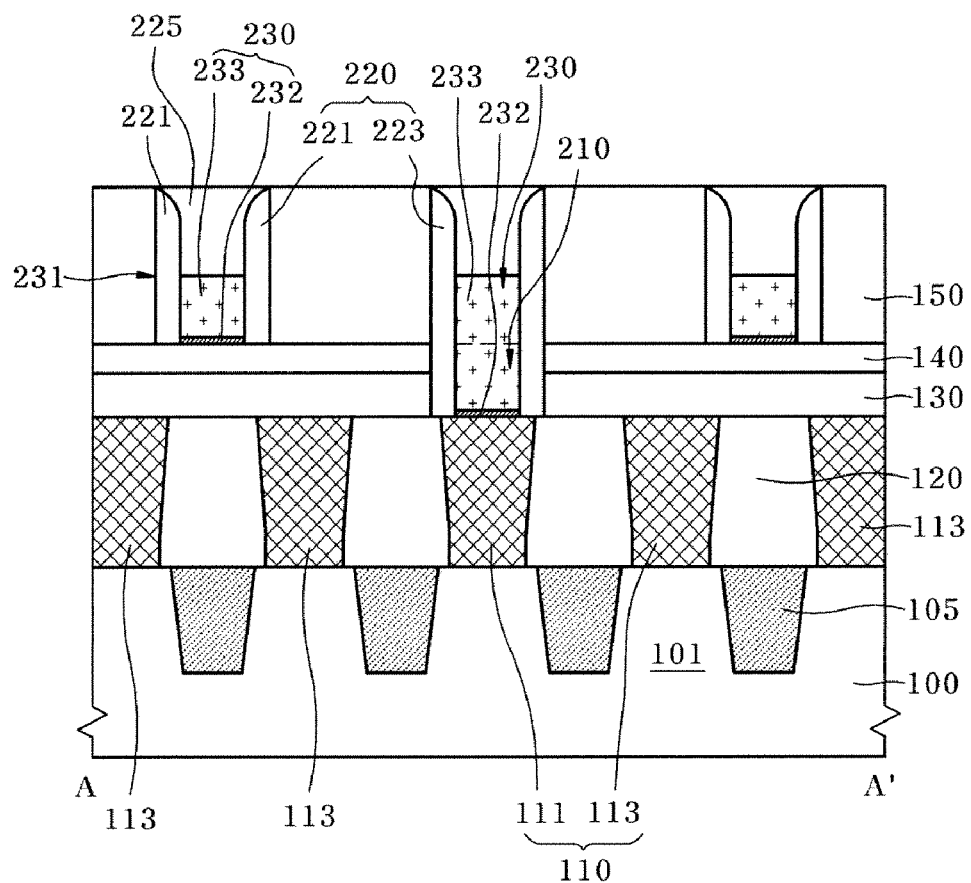
Figure 15:
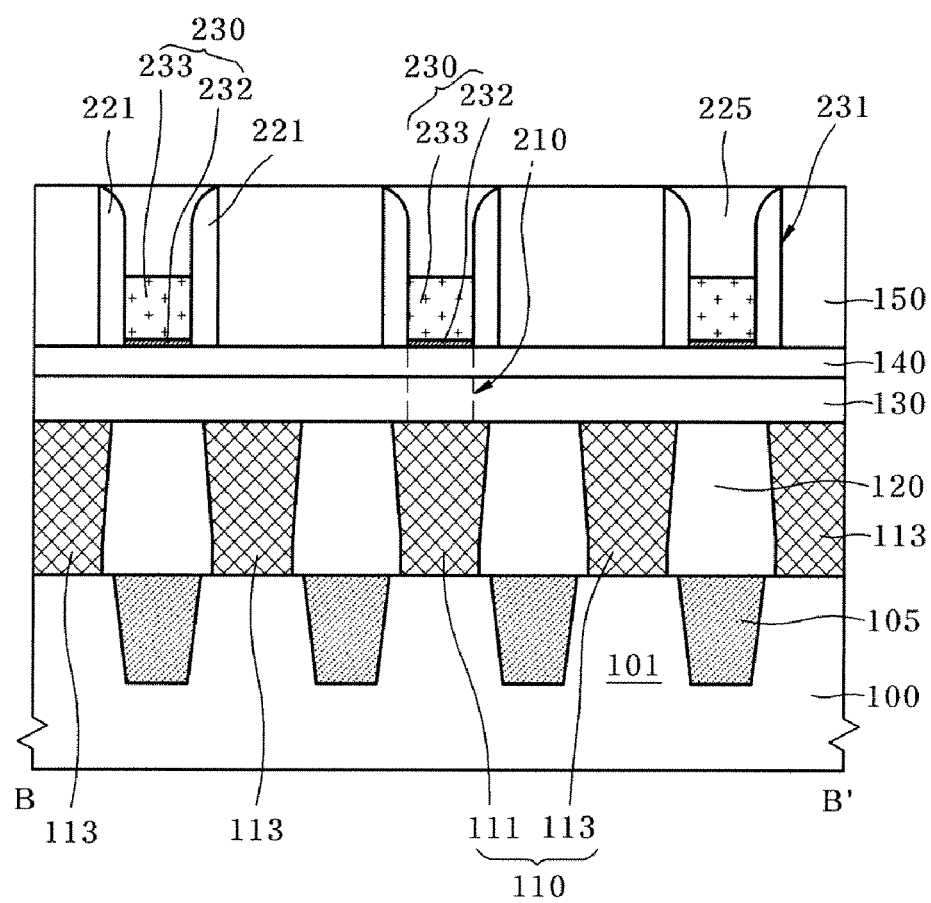

Referring to FIGS. 14 and 15, a barrier metal layer 232 is formed over a bottom of the contact hole 211 and a bottom of the trench 231. The barrier metal layer 232 can be a layer including titanium (Ti), titanium nitride (TiN) or tantalum nitride (TaN). After the barrier metal layer 232 is deposited, an etch back process is performed to leave the barrier metal layer 232 over the bottoms of the trench 231 and the contact hole 211.

After a conductive layer 233, such as a tungsten layer, is deposited over the barrier metal layer 232, the conductive layer 233 is etched back to be recessed so that a surface of the conductive layer 233 partially fills (but does not completely fill) the trench 231. As the result, a concaved shape is formed over the conductive layer 233. The conductive layer 233 is patterned to partially fill the trench 231 and a capping layer 225 which fills up the trench 231 is formed over the conductive layer 231. The capping layer 225 is formed by depositing an insulation material, such as silicon nitride, having an etch selectivity to the silicon oxide and performing planarization by Chemical Mechanical Polishing (CMP). The capping layer 225 is joined with the spacer 220 to protect the conductive layer 233.

A portion of the conductive layer 233 that fills the trench 231 is formed to the bit line 230 and the other portion of the conductive layer 233 that fills the contact hole 221 is formed to a bit line contact 210.

In an embodiment, a process of selectively etching the tungsten layer is not required because the shape of the bit line 230 is formed corresponding to the shape of the trench 231. Therefore, a gentle side wall profile accompanied when etching the tungsten layer can be avoided, so that the side wall of the bit line 230 has a vertical profile. Because the bit line 230 is patterned not by etch but by introduction of the trench, the space between the bit lines 230 can be more uniformly realized and electrical isolation between the bit lines 230 can be more reliably realized.

Figure 16:
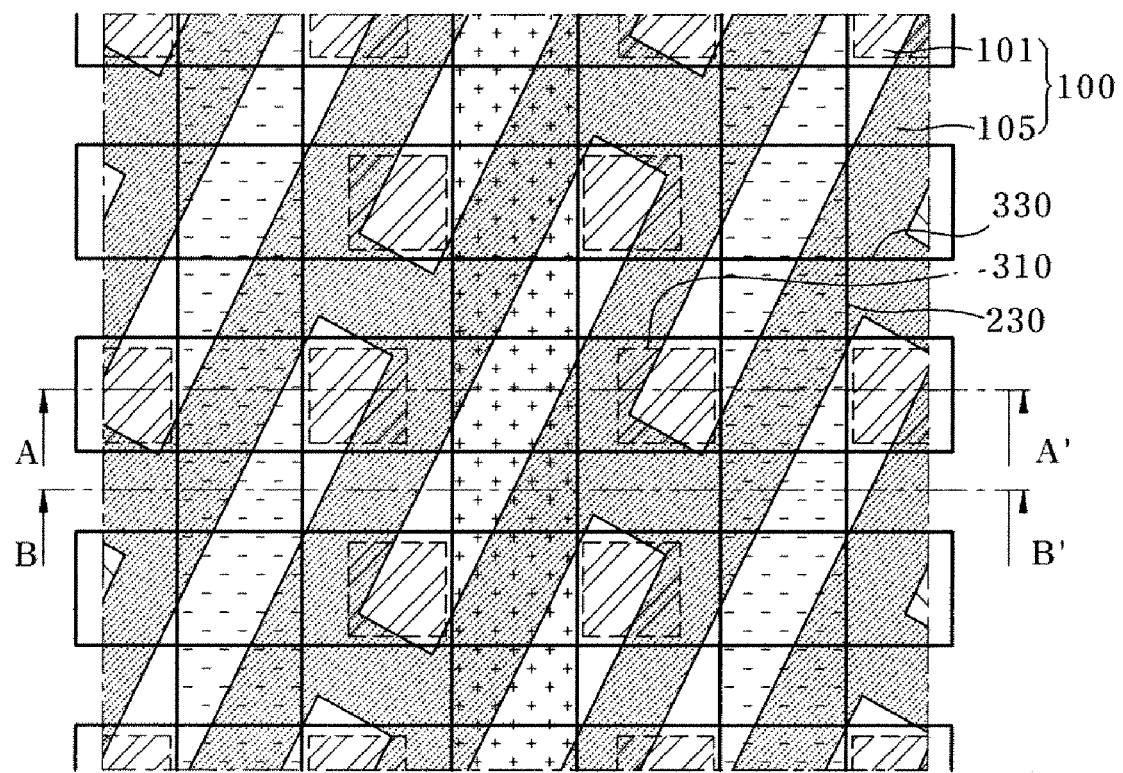
Figure 17:
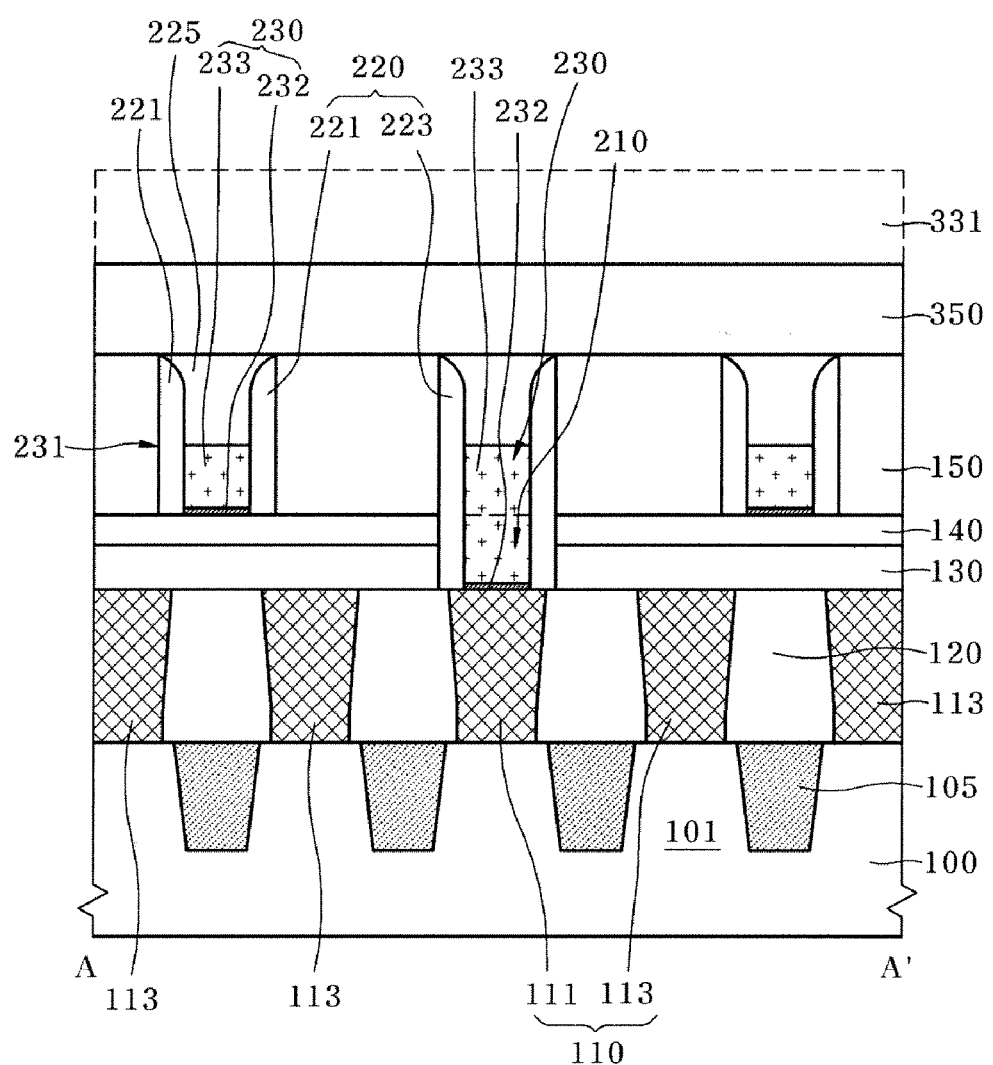
Figure 18:
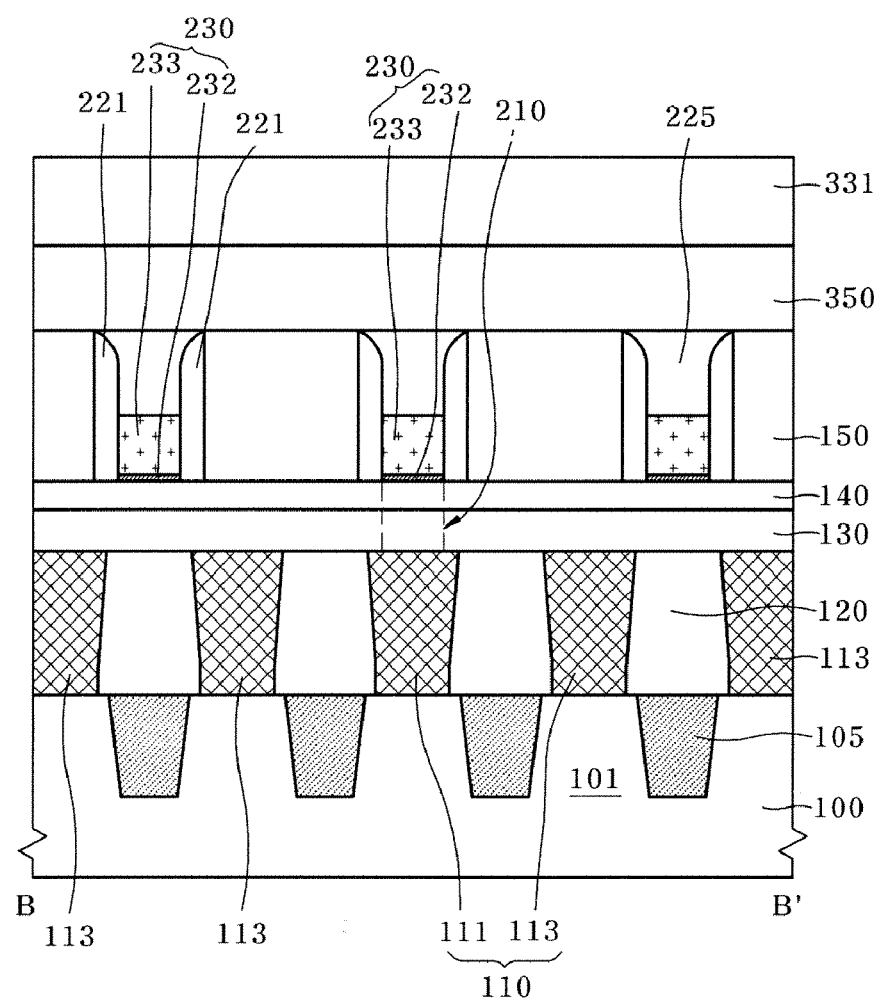

Referring to the plan view of FIG. 16 together with FIGS. 17 and 18, to form a storage node contact 310, passing through the bit line 230 and electrically connected to the storage node contact pad 113 therebelow, a process of forming a storage node contact hole by SAC process is carried out. While the storage node contact hole can be formed in an etch process such that an independent contact hole is formed with respect to an individual storage node contact, the storage node contact hole can be formed in such a line type SAC process that a third photoresist pattern 331 having a line type opening part 330 as shown in FIG. 16 is introduced.

A buffer layer 350 is formed over the capping layer 225 of the bit line 230. While it is possible to omit the formation of this buffer layer 350, this buffer layer 350 can be introduced to restrict damage of the bit line below in CMP in a node separation process which is performed in the SAC process. This buffer layer 350 can include a silicon oxide layer. The third photoresist pattern 331 having a line type opening part 330 as shown in FIG. 16 is formed over the buffer layer 350. The line type opening part 330 is delimited in a line or band shape so as to expose the portion where a plurality of storage contact is arranged and transverse to a plurality of the bit lines. By forming the third photoresist pattern 331 so as to have the line type opening part 330, a regular arrangement of the shape of line and space is pattern-transferred upon exposure of the third photoresist pattern 331. Therefore, it is possible to improve the exposure resolution and, thus, realize the third photoresist pattern 331 with more accurate shape.

Figure 19:
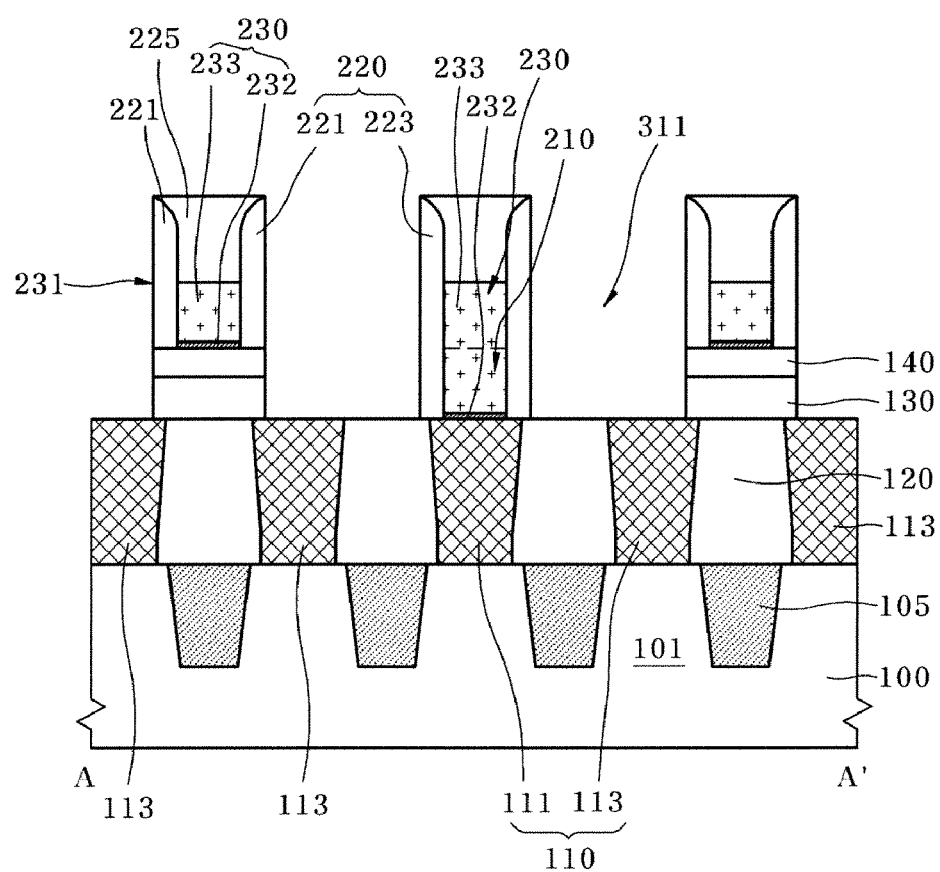
Figure 20:
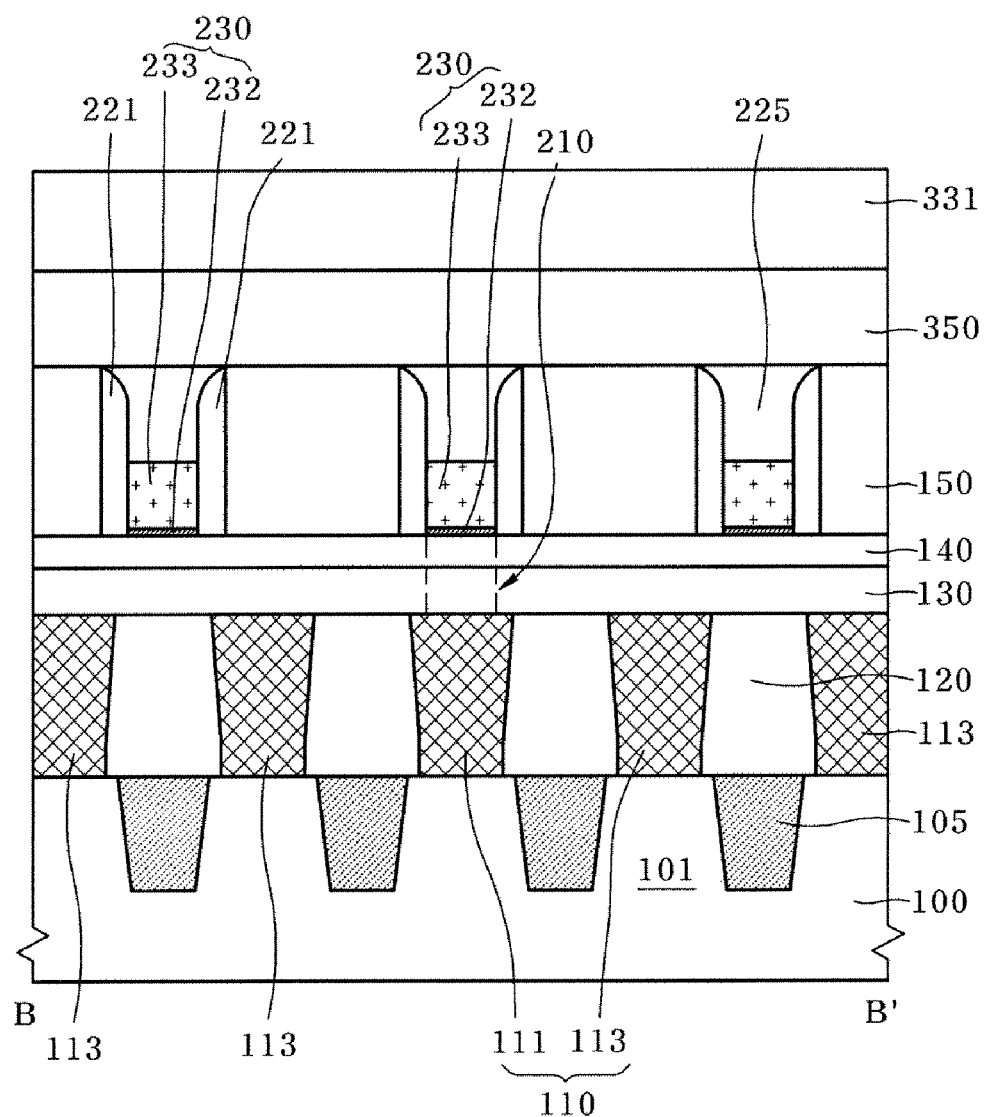

Referring to FIGS. 19 and 20, an exposed portion of the buffer layer 350, the portions therebelow of the second insulation layer 150, the etch stop layer 140, and the first insulation layer 130 are sequentially etched using the third photoresist pattern 331 as an etch mask to form the storage node contact hole 311, exposing the storage node contact pad 113. At this time, the capping layer 225 and the spacer 220 exposed by a selective etch functions as a barrier layer which restricts and inhibits the selective etch. Therefore, the storage node contact hole 331 is formed so as to expose the capping layer 225 and spacer 220 on the side wall thereof. By the first spacer 221 attached to the side wall of the bit line 230 and the second spacer 223 attached to the side wall of the bit line contact 210, the bit line 230 and the bit line contact 210 are isolated from the selective etch and, thus, not exposed.

Figure 2:
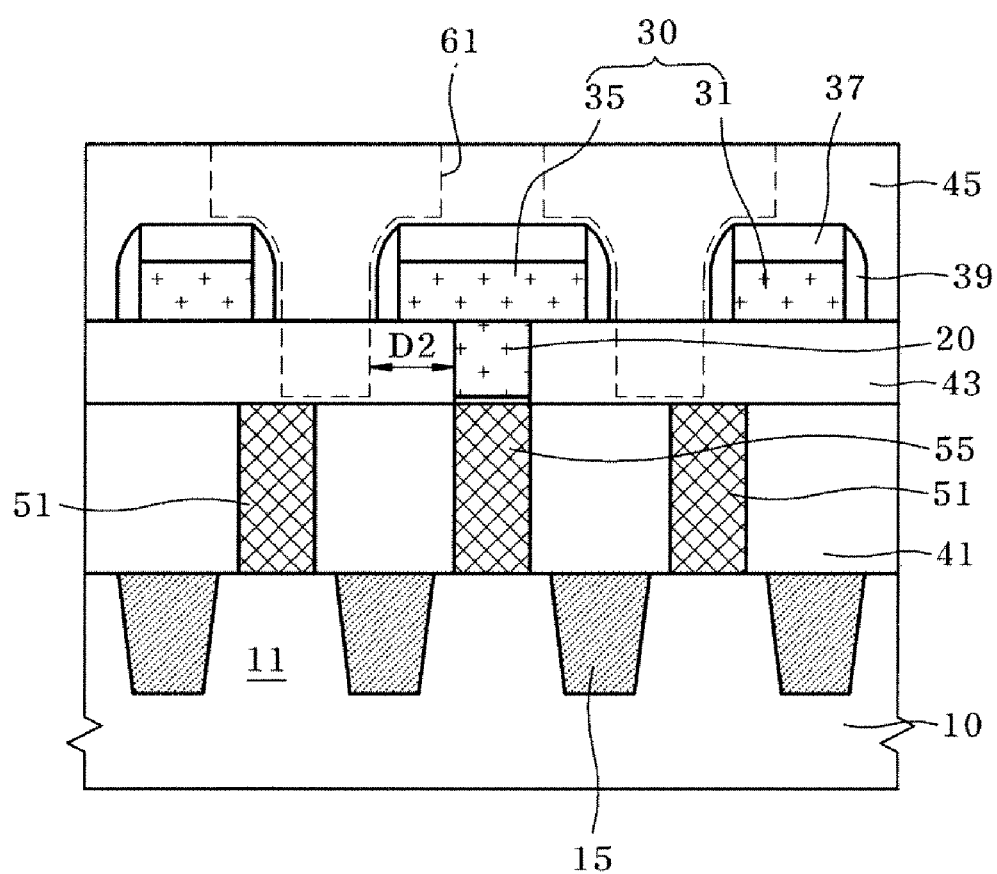

Because the spacer 220 is attached so as to be attached to the side wall of the trench 231, the outer wall of the spacer 220 has a substantially vertical profile. This structural shape of the spacer 220 restricts that the spacer 39 shown in FIG. 2 has a gently sloped profile at the upper end thereof, a thickness of which is thus relatively weak, and as the result, this shoulder part is etched and lost, thereby resulting in a short between the bit line 31 and the storage node contact.

After that, the third photoresist pattern 331 is selectively removed.

Figure 21:
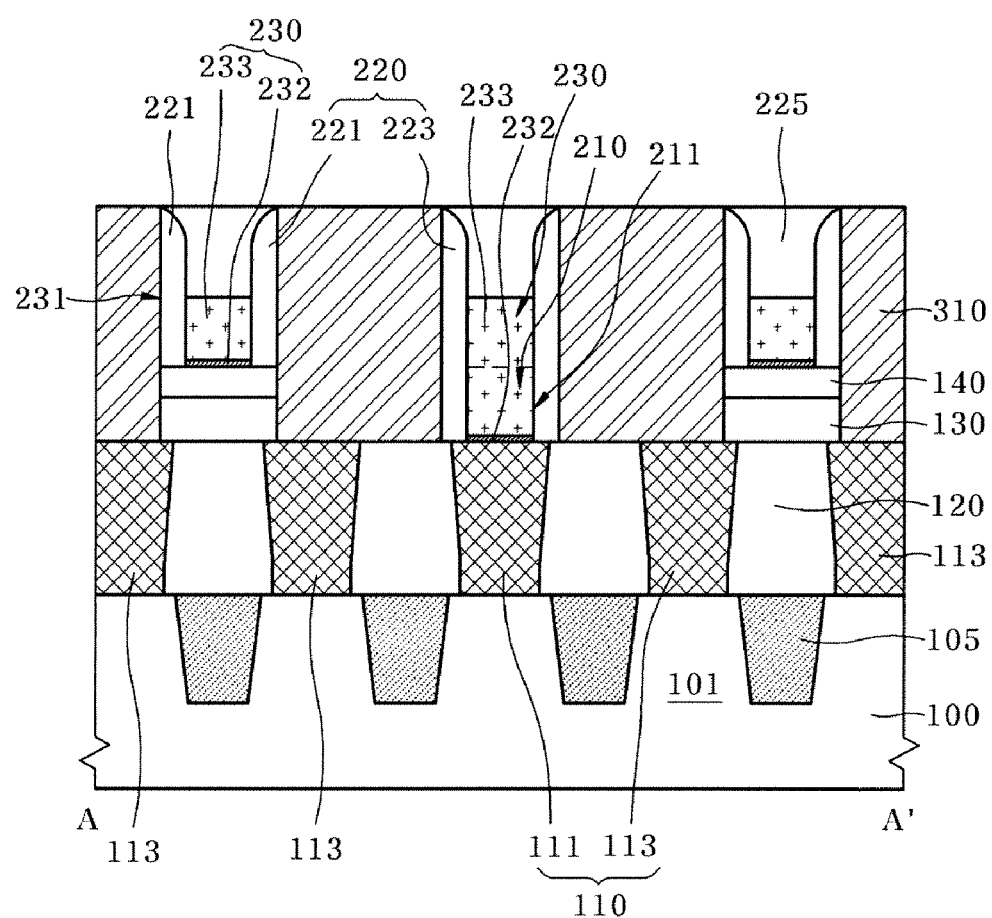
Figure 22:
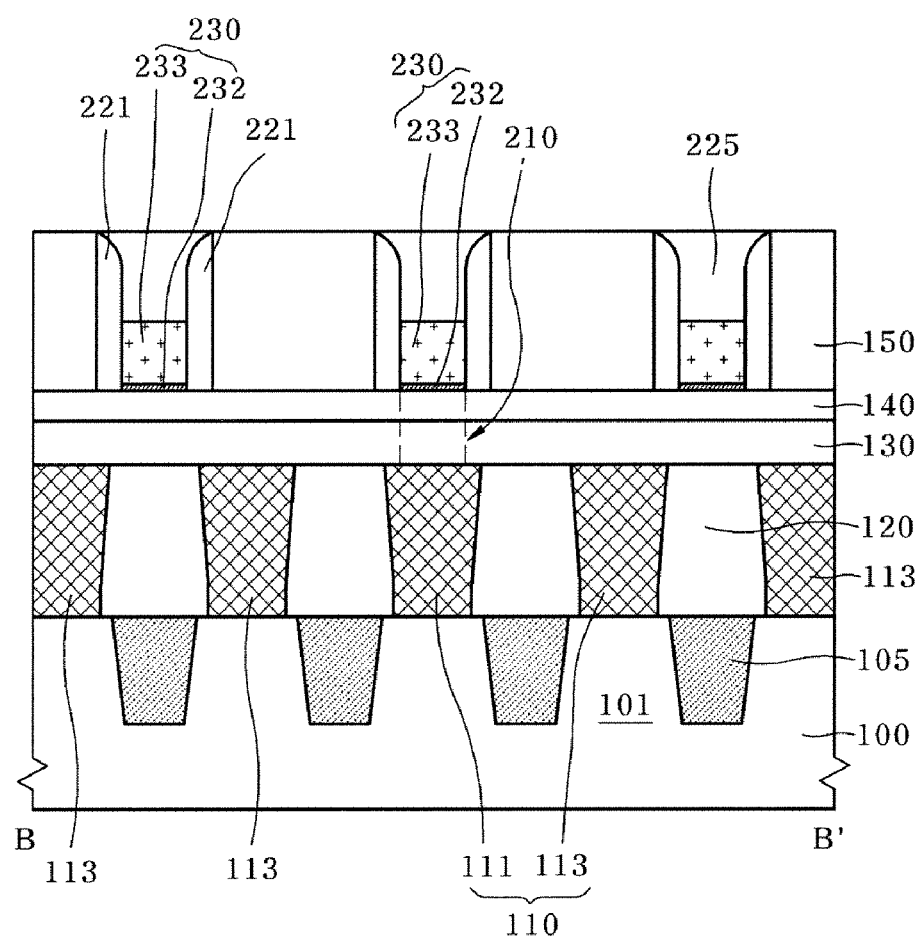
Figure 23:
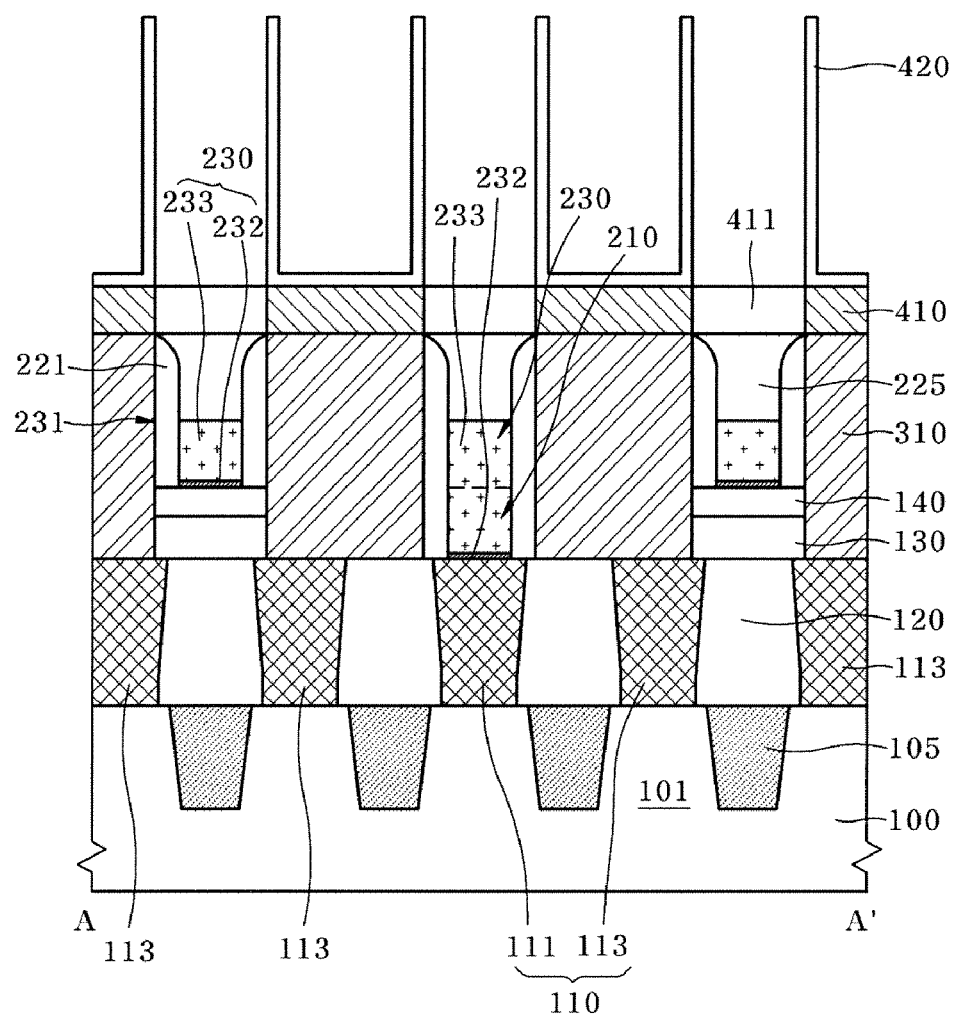

Referring to FIGS. 21 and 23, a conductive layer filling the storage node contact hole 311 is deposited, and then a node separation process is carried out to planarize the deposited conductive layer. The node separation process is carried out in such a process that the conductive layer is chemically mechanically polished to expose the upper surface of the capping layer 225 therebelow. By this polishing, the conductive layer is separated into storage node contacts 310 that fill the individual storage node contact holes 311, respectively. At this time, because the outer wall of the spacer 220 has a substantially vertical profile, the storage node contact 310 is also formed to have a vertical side wall profile.

FIG. 23 shows a storage node 420 of a capacitor electrically connected to the storage node contact 310. The storage node contact 420 can be formed to have a cylindrical shape for increasing a capacity of the capacitor. A dielectric layer (not shown) and a plate node (not shown) are formed over the storage node 420 to thereby realize the capacitor. Prior to forming the storage node 420, a landing pad 410 which electrically connects the storage node contact 310 and the storage node 420 can be formed penetrating the third insulation layer 410. When the storage node 420 and the storage node contact 310 overlap with a deviation from each other, the landing pad 410 can be introduced as a buffer that can relieve the deviation.

In an embodiment, patterning is carried out using the trench 231 and the contact hole 211 when the bit line 230 and the bit line contact 210 are formed. Therefore, it is possible to avoid a process of selectively etching the bit line 230. Because it is possible to avoid the etch process when patterning a metal layer for the bit line 230, such as tungsten, in which it is difficult to obtain a vertical side wall profile by an etch, it is possible to pattern so that the bit line 230 has a shape more closely corresponding to the designed layout. Also, because both the bit line 230 and the bit line contact 210 are isolated and protected by the spacer 220, it is possible to restrict corrosion or loss of them in subsequent SAC etch of the storage node contact hole 311. Furthermore, with this space, it is possible to realize more reliably the electrical isolation between the storage node contact 310, and the bit line 230 and the bit line contact 210.

The above embodiments of the invention are illustrative and not limitative. Throughout the specification, where methods and compositions are described as include steps or materials, it is contemplated that the methods and compositions can also consist essential of, or consist of, any combination of the recited steps or materials, unless described otherwise. While the invention has been described with respect to the specific embodiments, it will be apparent to those skilled in the art that various changes and modifications may be made without departing from the spirit and scope of the invention as defined in the following claims.

What is claimed is:

1. A method for manufacturing a wire structure of a semiconductor device, the method comprising:
   obtaining a layout of an active region in a semiconductor substrate, the layout extending in a direction diagonally intersecting a layout of a bit line;
   forming an isolation layer that delimits the active region;
   forming over the semiconductor substrate a stack of a first insulation layer, an etch stop layer, and a second insulation layer;
   forming a contact hole penetrating the stack;
   forming over the second insulation layer a first mask layer, the first mask layer comprising a filler that fills the contact hole;
   patterning the first mask layer to expose a portion of the second insulation layer according to the layout of the bit line;
   selectively etching the exposed portion of the second insulation layer using the first mask pattern and the filler as an etch mask to form a trench exposing a surface of the etch stop layer over a bottom thereof and partially overlapping with the contact hole;
   selectively removing the first mask pattern and the filler;
   forming a spacer over a side wall of the trench and a side wall of the contact hole;
   forming a bit line contact which fills the contact hole and the bit line which partially fills the trench to expose an upper side part of the spacer; and,
   forming a capping layer over the bit line, the capping layer filling the trench to be connected to the spacer and protecting the upper part of the bit line,
   wherein forming the contact hole comprises:
   forming over the first insulation layer a second mask layer comprising a carbon layer and a first interfacial separation layer comprising silicon oxynitride (SiON);

forming over the first interfacial separation layer a first photoresist pattern exposing the portion where the bit line and the active region intersect with each other;

selectively etching the second mask layer using the first photoresist pattern as an etch mask to form a second mask pattern; and selectively etching the first insulation layer using the second mask pattern as an etch mask to form the contact hole.

2. The method of claim 1, wherein the bit line is delimited to a straight line in which a Critical Dimension (CD) of the portion intersecting with the active region and a CD of a portion extended from the intersection portion toward an outside are equal.

3. The method of claim 1, wherein the active region is arranged in plural according to a $6F^2$ cell layout.

4. The method of claim 1 further comprising forming a bit line contact pad below the first insulation layer, wherein the bit line contact pad electrically connects the active region and the bit line contact.

5. The method of claim 1, wherein forming the first mask layer comprises redepositing carbon over the second mask pattern.

6. The method of claim 1, wherein the first mask layer comprises a carbon layer.

7. The method of claim 1, wherein the patterning of the first mask layer comprises:
forming over the first mask layer a second interfacial separation layer comprising silicon oxynitride (SiON);
forming over the second interfacial separation layer a second photoresist pattern exposing a portion of the layout of the bit line, wherein a CD of the exposed portion is equal to a CD of the contact hole; and
selectively etching the first mask layer using the second photoresist pattern as an etch mask to form the first mask pattern.

8. The method of claim 1, wherein the forming of the spacer comprises:
forming a spacer layer on side walls of the trench and the contact hole; and
etching back the spacer layer to expose the etch stop layer on bottoms of the trench and the contact hole.

9. The method of claim 1, wherein the forming the bit line comprises:
forming a barrier metal layer covering the bottoms of the trench and the contact hole;
depositing over the barrier metal layer a metal layer comprising tungsten (W); and
etching back the metal layer to expose an upper side part of the spacer.

10. The method of claim 1, wherein the forming of the capping layer comprises:
depositing a third insulation layer comprising silicon nitride, the third insulation layer filling up the trench; and
planarizing the third insulation layer by Chemical Mechanical Polishing (CMP).

11. A method for manufacturing a wire structure of a semiconductor device, the method comprising:
obtaining a layout of an active region in a semiconductor substrate, the layout extending in a direction diagonally intersecting a layout of a bit line;
forming an isolation layer that delimits the active region;
forming over the semiconductor substrate a stack of a first insulation layer, an etch stop layer, and a second insulation layer;
forming a contact hole penetrating the stack;
forming over the second insulation layer a first mask layer filling the contact hole;
forming a first mask pattern exposing a portion of the second insulation layer according to the layout of the bit line, with accompanying of a filler, which fills the contact hole, by patterning the first mask layer;
selectively etching the exposed portion of the second insulation layer using the first mask pattern and the filler as an etch mask to form a trench exposing a surface of the etch stop layer over a bottom thereof and partially overlapping with the contact hole;
selectively removing the first mask pattern and the filler;
forming a spacer over a side wall of the trench and a side wall of the contact hole;
forming a bit line contact which fills the contact hole and the bit line which partially fills the trench to expose an upper side part of the spacer;
forming a capping layer over the bit line, the capping layer filling the trench to be connected to the spacer and protecting the upper part of the bit line;
performing, on the second insulation layer, a Self Aligned Contact (SAC) etch process using the capping layer and the spacer as an etch barrier to form a storage node contact hole that penetrates the stack; and,
forming a storage node contact filling the storage node contact hole,
wherein forming the contact hole comprises:
forming over the first insulation layer a second mask layer comprising a carbon layer and a first interfacial separation layer comprising silicon oxynitride (SiON);
forming over the first interfacial separation layer a first photoresist pattern exposing the portion where the bit line and the active region intersect with each other;
selectively etching the second mask layer using the first photoresist pattern as an etch mask to form a second mask pattern; and
selectively etching the first insulation layer using the second mask pattern as an etch mask to form the contact hole.

12. The method of claim 11, wherein the forming of the storage node contact hole comprises:
forming over the second insulation layer a third mask pattern having a line type opening part, which transverses a plurality of the bit lines; and
selectively etching a portion of the second insulation layer exposed by the third mask pattern, and
wherein the forming of the storage node contact comprises:
depositing a conductive layer filling the storage node contact; and
planarizing the conductive layer with inclusion of Chemical Mechanical Polishing (CMP).

* * * * *